United States Patent
Yeh et al.

(10) Patent No.: US 9,899,305 B1
(45) Date of Patent: Feb. 20, 2018

(54) SEMICONDUCTOR PACKAGE STRUCTURE

(71) Applicant: TAIWAN SEMICONDUCTOR MANUFACTURING COMPANY LTD., Hsinchu (TW)

(72) Inventors: Ting-Yu Yeh, Hsinchu (TW); Wei-Ming Chen, Taipei (TW); Yi-Chiang Sun, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/581,667

(22) Filed: Apr. 28, 2017

(51) Int. Cl.
- *H01L 23/48* (2006.01)
- *H01L 23/50* (2006.01)
- *H01L 23/34* (2006.01)
- *H01L 23/367* (2006.01)
- *H01L 23/498* (2006.01)
- *H01L 23/13* (2006.01)
- *H01L 23/00* (2006.01)

(52) U.S. Cl.
CPC ........ *H01L 23/49816* (2013.01); *H01L 23/13* (2013.01); *H01L 23/49827* (2013.01); *H01L 24/17* (2013.01); *H01L 2924/1816* (2013.01); *H01L 2924/3511* (2013.01)

(58) Field of Classification Search
CPC ......... H01L 23/29816; H01L 23/39827; H01L 23/13; H01L 24/17; H01L 2924/3511; H01L 2924/1816
USPC ....... 257/686, 695, 703–713, 717, 721, 723, 257/685, 675, 737, 738, 778, 786, 787
See application file for complete search history.

(56) References Cited

U.S. PATENT DOCUMENTS

| | | | | |
|---|---|---|---|---|
| 5,886,408 | A * | 3/1999 | Ohki | H01L 23/16 257/705 |
| 6,497,943 | B1 * | 12/2002 | Jimarez | B32B 15/08 174/255 |
| 9,299,635 | B2 * | 3/2016 | Lee | H01L 23/42 |
| 9,761,571 | B2 * | 9/2017 | Scanlan | H01L 25/50 |
| 2005/0001311 | A1 * | 1/2005 | Ho | H01L 23/36 257/712 |
| 2007/0158823 | A1 * | 7/2007 | Dani | H01L 23/3737 257/712 |
| 2009/0057881 | A1 * | 3/2009 | Arana | H01L 23/473 257/714 |
| 2009/0250803 | A1 * | 10/2009 | Arai | H01L 21/568 257/690 |
| 2010/0109169 | A1 * | 5/2010 | Kolan | H01L 21/486 257/787 |
| 2011/0133321 | A1 * | 6/2011 | Ihara | H01G 2/065 257/676 |
| 2011/0147916 | A1 * | 6/2011 | Su | H01L 21/54 257/692 |

(Continued)

*Primary Examiner* — Alexander Oscar Williams
(74) *Attorney, Agent, or Firm* — WPAT, P.C., Intellectual Property Attorneys; Anthony King

(57) ABSTRACT

A semiconductor package structure is disclosed. The semiconductor package structure includes: a substrate having a front surface and a back surface; a chip-on-interposer structure mounted on the front surface of the substrate; a back side stiffener mounted over the back surface of the substrate and surrounding a projection of the chip-on-interposer structure from a back surface perspective; and a plurality of conductive bumps mounted on the back surface of the substrate.

20 Claims, 6 Drawing Sheets

(56) References Cited

U.S. PATENT DOCUMENTS

| | | | |
|---|---|---|---|
| 2012/0049339 A1* | 3/2012 | Wang | H01L 21/563 257/693 |
| 2012/0075807 A1* | 3/2012 | Refai-Ahmed | H01L 23/13 361/719 |
| 2013/0217188 A1* | 8/2013 | Wang | H01L 21/563 438/118 |
| 2013/0256872 A1* | 10/2013 | Su | H01L 23/3677 257/737 |
| 2013/0270691 A1* | 10/2013 | Mallik | H01L 21/50 257/713 |
| 2013/0277855 A1* | 10/2013 | Kang | H01L 23/49816 257/774 |
| 2014/0134803 A1* | 5/2014 | Kelly | H01L 21/76251 438/118 |
| 2014/0134804 A1* | 5/2014 | Kelly | H01L 23/147 438/118 |
| 2014/0175665 A1* | 6/2014 | Kang | H01L 23/481 257/774 |
| 2015/0035134 A1* | 2/2015 | Hung | H01L 23/3675 257/712 |
| 2015/0035135 A1* | 2/2015 | Hung | H01L 23/3672 257/712 |
| 2016/0300815 A1* | 10/2016 | Kim | H01L 25/0657 |
| 2016/0379915 A1* | 12/2016 | Lee | H01L 23/498 257/737 |
| 2017/0011993 A1* | 1/2017 | Zhao | H01L 23/49838 |
| 2017/0084596 A1* | 3/2017 | Scanlan | H01L 25/50 |
| 2017/0117205 A1* | 4/2017 | Groothuis | H01L 23/3675 |
| 2017/0148767 A1* | 5/2017 | Hung | H01L 25/0657 |
| 2017/0170155 A1* | 6/2017 | Yu | H01L 21/56 |

* cited by examiner

SEMICONDUCTOR PACKAGE STRUCTURE

BACKGROUND

In the packaging of integrated circuits, particular flip chip packaging, warpage and stress are generated due to the mismatch in Coefficients of Thermal Expansion (CTEs) between different materials and different package components. The warpage and stress are major concerns in the improvement in the reliability of package structures.

For these reasons and other reasons that will become apparent upon reading the following detailed description, there is a need for an improved flip chip package that overcomes the problems discussed above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
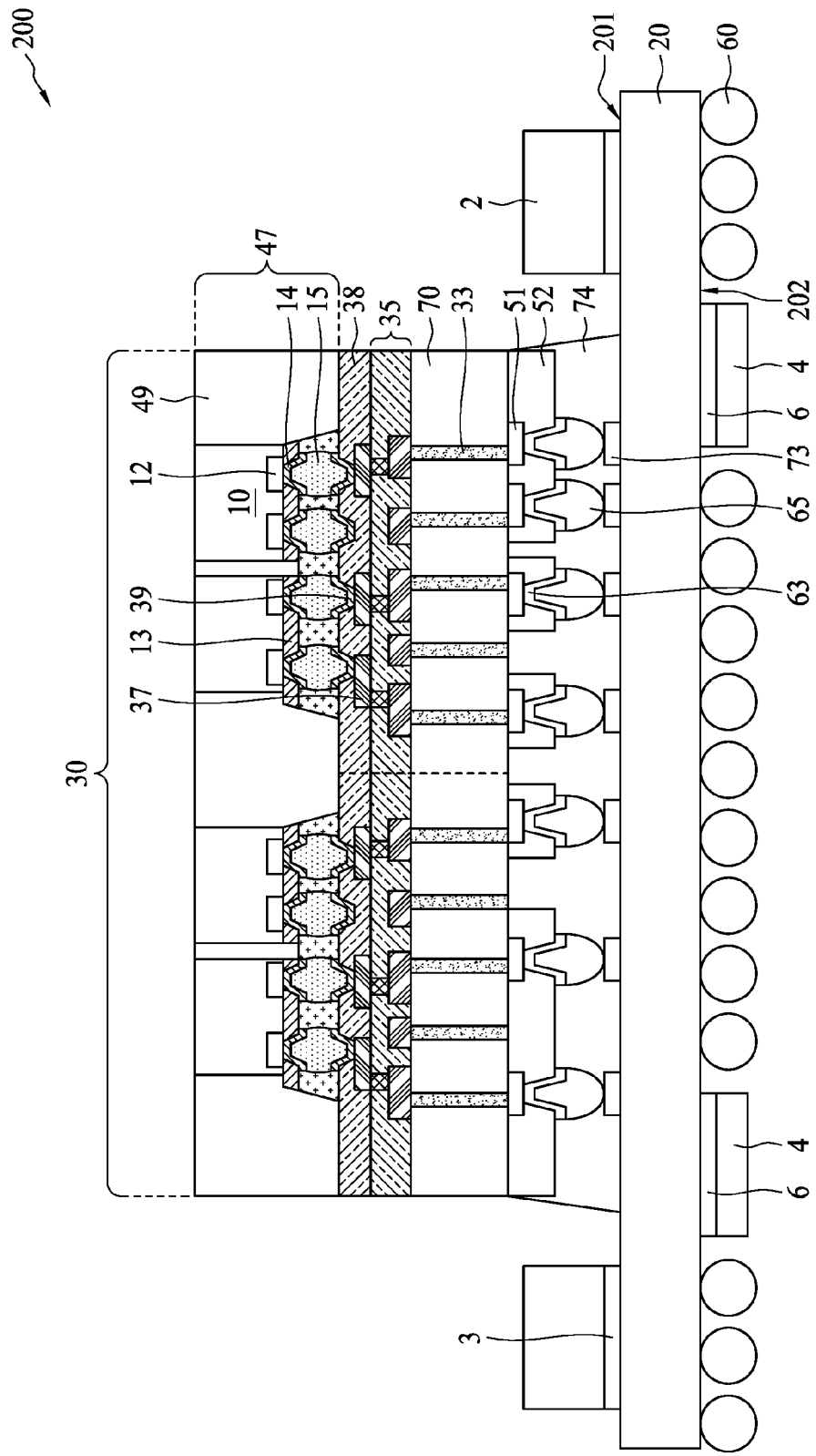
FIG. 1 is a cross-sectional view of a semi-finished package structure showing a back side stiffener mounted to a back side of a substrate, according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the microelectronics industry, a semiconductor device, such as a single chip, a three-dimensional (3D) IC, a chip on (chip-on-substrate, CoS, or Chip-on-wafer, CoW) structure, carrying an integrated circuit is commonly mounted on a package carrier, such as a substrate, a circuit board or a leadframe that provides electrical connections from the semiconductor device to the exterior of the package. In one such packaging arrangement called semiconductor device mounting, the semiconductor device includes an area array of electrically conductive contacts, known as bond pads that are electrically connected to corresponding area array of electrically-conductive contacts on the substrate known as solder bumps. Typically, the solder bumps are registered with the bond pads and a reflow process is applied to create electrical connections in the form of solder joints between the semiconductor device and the substrate. The process of semiconductor device mounting results in a space or gap between the semiconductor device and the substrate.

The semiconductor device and the substrate are usually formed of different materials having mismatched coefficients of thermal expansion (CTE). As a result, the semiconductor device and the substrate experience significantly different dimensional changes when heated that creates significant thermally induced stresses in the electrical connections between the semiconductor device and the substrate. If uncompensated, the disparity in thermal expansion can result in degradation in the performance of the semiconductor device, damage to the solder joints, or package failure. As the size of the semiconductor device increases, the effect of a mismatch in the coefficient of thermal expansion between the semiconductor device and the substrate becomes more pronounced. In stacked die packages, the mismatch in coefficient of thermal expansion between the die laminate and the package may be even greater than in single die packages. The failure mechanism in stacked die packages may shift from solder joint damage to die damage.

To improve the reliability of electrical connections in semiconductor device package assemblies, it is common in the microelectronics industry to fill the gap between the semiconductor device and the substrate with an encapsulant material, or underfill. The underfill increases the fatigue life of the package and improves the reliability of the electrical connections by reducing the stress experienced by the electrical connections during thermal cycling (e.g., changes in temperature) or when the semiconductor device and the substrate have a significant temperature differential.

To further enhance the rigidity of the package assembly, front side stiffeners are often employed in the package assembly. A front side stiffener (also sometimes referred to as a "front side picture frame") is a rigid tetragonal ring-like structure made from a material such as metal having substantially the same dimensions as the package substrate with a window in its center. The front side stiffener attaches on the front side of the substrate and surrounds the semiconductor device to constrain the substrate in order to prevent its warpage or other movement relative to the semiconductor device, which may be caused by thermal cycling during package assembly, reliability testing, or field operation.

FIG. 1 is a cross-sectional view of a semi-finished package structure 200 showing a back side stiffener 4 mounted to a back surface 202 of a substrate 20, according to one embodiment of the present disclosure. The semi-finished package structure 200 includes a front side stiffener 2 mounted to a front surface 201 through an adhesive 3. In the exemplary embodiment, the semiconductor structure 30 may include a Chip-on-wafer (CoW) structure. The CoW structure is also known as the chip-on-silicon substrate structure or the chip-on-interposer structure. The CoW structure is mounted to the front surface 201 of the substrate 20, such as a printed circuit board (PCB) or a multilayer module, and together form a CoW-on-substrate (CoWoS) structure 200. However, this is not a limitation of the present disclosure. In some embodiments, the semiconductor structure 30 may be a single chip, a three-dimensional (3D) IC or any other semiconductor component such as a passive component.

Referring to FIG. 1, it depicts that an interposer 70, such as a wafer, stacked with the molded chip 47 thereon through a chip-on-wafer process. The interposer 70 herein may be made of, for example, silicon or other suitable materials such as ceramic, glass, plastic, resin or epoxy. The molded chip 47 may include several dies 10 encapsulated in a molding material 49. The dies 10 are chosen and put together for certain functions and include, for example, microprocessor devices with program memory storage such as FLASH or EEPROM devices, or microprocessors with application specific processors such as baseband transceivers, graphics processors, cache memory devices, memory management devices, and analog to digital converters for sensor applications. Each die 10 may have a plurality of terminals 12, which refer to conductive pads or bond pads. An under bump metallization (UBM) 14 is deposited adjacent to the terminals 12 and supported by a dielectric layer 13.

The interposer 70 includes through interposer vias (TIV) 33 extending from an upper surface to a bottom surface of the interposer 70. A redistribution layer (RDL) 35 may be formed over the upper surface of the interposer 70. The RDL 35 includes a dielectric layer and patterned conductors coupled with the TIVs 33 in order to create an electrical connection. Conductive pads 37 are formed in a dielectric layer 38 between the RDL 35 and the molded chip 47. A plurality of conductive bumps 15 are used to couple the dies 10 to the TIVs 33 through UBM 39 and conductive pads 37.

At the bottom surface of the interposer 70, a plurality of conductive pads 51 are coupled to the TIVs 33. UBMs 63 electrically connect with the conductive pads 51, wherein the UBMs 63 are surrounded and supported by the polymeric layer 52. Conductive bumps 65 are disposed adjacent to the UBMs 63, wherein the conductive bumps 65 may be implemented by controlled collapse chip connection (C4) bumps. The interposer 70 is connected to the substrate 20 by contacting the conductive bumps 65 with conductive pads 73 of the substrate 20. An underfill layer 74 is filled between the interposer 70 and the substrate 20 to stiffen the package structure 10 and further protect the semiconductor structure 30 from flexural damage. A set of solder balls 60 is arranged at the back surface 202 of the substrate 20. In some embodiments, the package structure 200 further includes a heat spreader disposed over the semiconductor structure 30 and fixed to a top of the front side stiffener 2.

The front side stiffener 2 may be a flat structure having substantially the same dimensions as the substrate 20 and has an opening therein to expose the semiconductor structure 30. One purpose of the front side stiffener 2 is to constrain the substrate 20 in order to prevent its warpage or other movement relative to the semiconductor structure 30, which may be caused by thermal cycling during package assembly, reliability testing, or field operation. Such movement may result from the different coefficients of thermal expansion (CTE) of the semiconductor structure 30 and substrate materials. However, as noted above even with the use of front side stiffener 2 in the package 10, the package 10 may still suffer warpage to some degree. Due to the different coefficients of thermal expansion of the die and substrate materials, the substrate tends to warp, the substrate typically bowing into a convex shape. The front side stiffener 2 may reduce to some extent this warpage, for example, about 25% to about 45% of the warpage can be mitigated.

Since even with the use of the front side stiffener 2 in the package structure 10, the package still suffers warpage to some degree. In particular, the front side stiffener 2 is designed with respect to the substrate 20 as a whole instead of focusing on the area of the semiconductor structure 30. The warpage and stress around the area of the semiconductor structure 30 may lead to performance degradation or package failure. As such, the back side stiffener 4 is employed to strengthen the package structure 200. The back side stiffener 4 is mounted to the back surface 202 through an adhesive 6. The adhesive 6 may include material(s) the same or similar to the adhesive 3, while material(s) of the back side stiffener 4 may or may not be the same with the stiffener 2. The back side stiffener 4 is formed of a rigid yet flexible material. In one exemplary embodiment, the back side stiffener 4 includes a metal such as pure copper (C1100), brass or stainless steel. However, this is not a limitation of the present disclosure. In some embodiments, the back side stiffener 4 may include aluminum, or copper tungsten. In another embodiment, the back side stiffener 4 may include a ceramic material. In yet another embodiment, the back side stiffener 4 may include a silicon containing material. In yet another embodiment, the back side stiffener 4 may include a composite alloy. In yet another embodiment, the back side stiffener 4 may include a plastic material.

Figure 2:
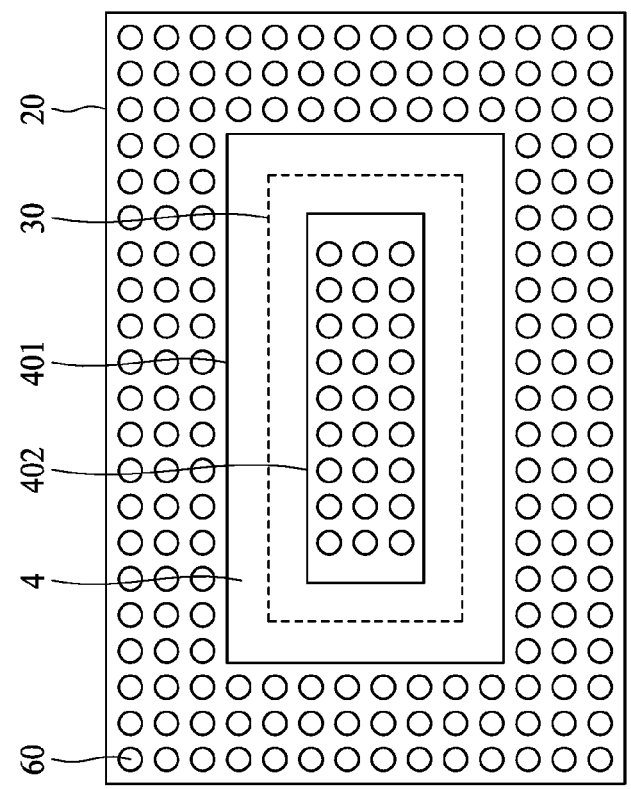
FIG. 2 illustrates a top surface perspective and a back surface perspective of the package structure of FIG. 1.
Figure 2:
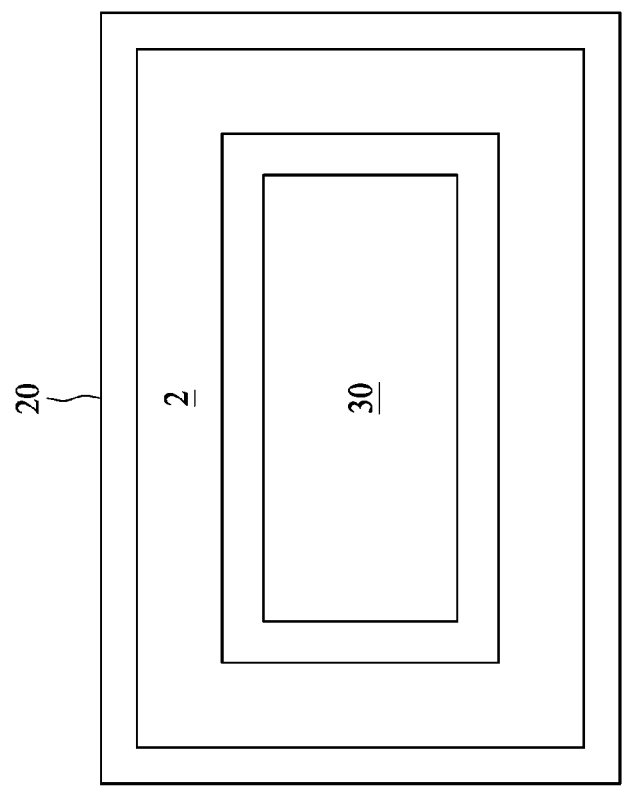

A dimension of the back side stiffener 4 is determined according to a dimension of the semiconductor structure 30. For ease of understanding, FIG. 2 illustrates a top surface perspective and a back surface perspective of the package structure 200 of FIG. 2. The left side of FIG. 2 shows the top surface perspective and the right side shows the back surface perspective. As can be seen from the top surface perspective, the front side stiffener 2 (the portion having dark color in the top surface perspective) is a tetragonal ring-like structure disposed substantially along four edges of the substrate 20. In specific, the front side stiffener 2 may not be formed exactly along and overlap the four edges of the substrate 20 but being inwardly retracted from the four edges of the substrate 20 by a predetermined distance. However, the dimension of the front side stiffener 2 is still correlated to the dimension of the substrate 20 as can be more clearly identified in a subsequent embodiment shown in FIG. 3 and FIG. 4. The back side stiffener 4 (the portion having dark color in the back surface perspective), on the other hand, has its position and dimension correlated to the semiconductor structure 30. The semiconductor structure 30 is illustrated in dashed lines in the back surface perspective. According to an exemplary embodiment, when seeing from the back surface perspective, the back side stiffener 4 is a tetragonal ring-like structure overlapping a projection of at least four edges of the semiconductor structure 30. In other words, an outer portion or an outer tetragonal ring of the back side stiffener 4 (i.e. the dark colored portion between outer edges 401 of the back side stiffener 4 and the edges of the semiconductor structure 30 in dashed lines) does not overlap a projection of the semiconductor structure 30; and an inner portion or an inner tetragonal ring of the back side stiffener 4 (i.e. the dark colored portion between the edges of the semiconductor structure 30 in dashed lines and inner edges 402 of the back side stiffener 4) overlaps the projection of the semiconductor structure 30.

Compared to the front side stiffener 2, the back side stiffener 4 has its position and dimension correlated to the semiconductor structure 30 is helpful to reduce the package warpage in particular to the flip chip region around the semiconductor structure 30. A larger space reserved for the back side stiffener 4 allows the back side stiffener 4 to have a wider width and a stronger architecture for mitigating the package warpage around the semiconductor structure 30. However, the solder balls 60 may be forced to arrange in a way different from the original arrangement and may have a more complicated routing in the substrate 20. The total number of the solder balls 60 may be sacrificed as well. In the exemplary embodiment, the outer tetragonal ring of the back side stiffener 4 has a width occupies at least a space for disposing one column or one row of the solder balls 60. On the other hand, the inner tetragonal ring of the back side stiffener 4 has a width occupies at least a space for disposing one column or one row of the solder balls 60 as well. However, this is not a limitation of the present disclosure. In some embodiment, the width of the outer tetragonal ring or inner tetragonal ring of the back side stiffener 4 may be less than this dimension.

In the exemplary embodiment, the width of the outer tetragonal ring is substantially the same with the width of the inner tetragonal ring. That is the width of the outer tetragonal ring is substantially 50% of the width of the back side stiffener ring 4, and the width of the inner tetragonal ring is also substantially 50% of the width of the back side stiffener ring 4. However, this is not a limitation of the present disclosure.

In the exemplary embodiment, the space within inner edges 402 of the back side stiffener 4 is still can be used for disposing the solder balls 60. Therefore, the present disclosure can have an improved package warpage focused on the flip chip region without losing too much solder balls 60 space. A requirement of the dimension of the stiffener 4 is that a height of the stiffener 4 is limited to be relatively lower than a height of the solder balls 60. In this way, the package structure 200 can be assembled to another substrate through the solder balls 60 without being stuck by the back side stiffener 4. The another substrate may be a printed wire board (also sometimes called a printed circuit board) or a multilayer module known to those skilled in the art.

Figure 3:
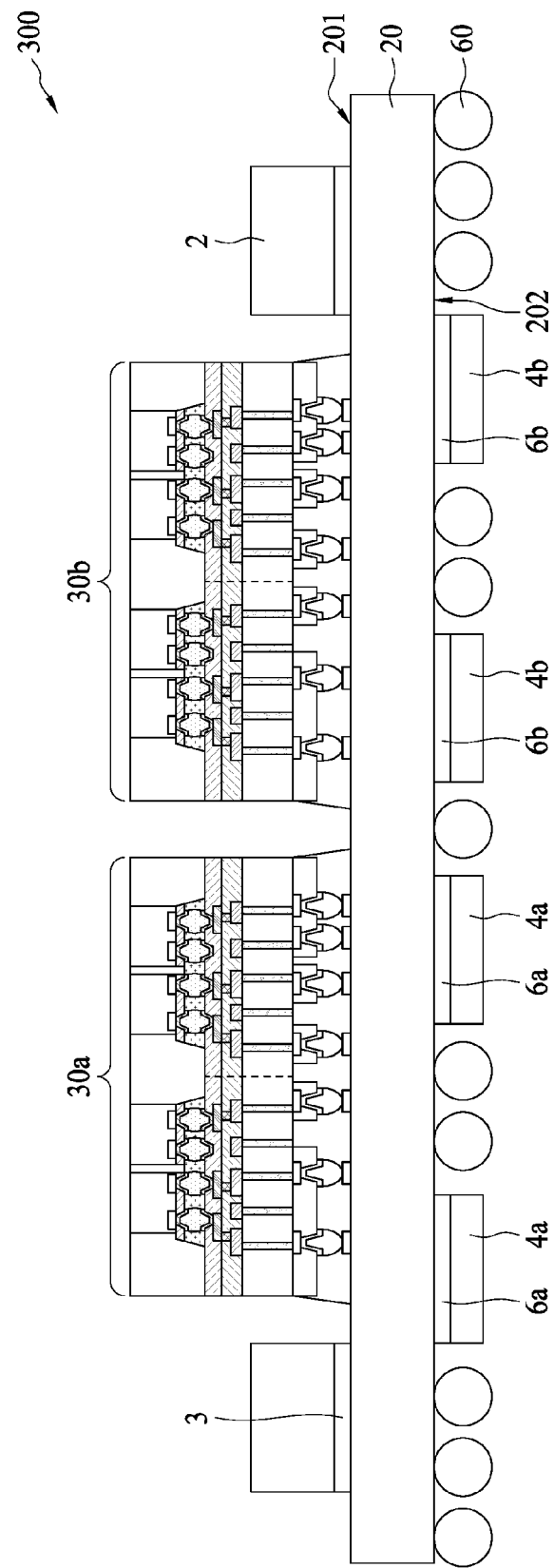
FIG. 3 is a cross-sectional view of a semi-finished package structure showing two back side stiffeners mounted to a back side of a substrate, according to one embodiment of the present disclosure.

FIG. 3 is a cross-sectional view of a semi-finished package structure 300 showing two back side stiffeners 4a and 4b mounted to a back surface 202 of a substrate 20, according to one embodiment of the present disclosure. Features in FIG. 3 that are similar to analogous features in FIG. 1 are similarly numbered for the sake of simplicity and clarity. The back side stiffeners 4a and 4b may be mounted to the back surface 202 through adhesives 6a and 6b. The back side stiffeners 4a and 4b may include material(s) the same or similar to the stiffener 4; and the adhesives 6a and 6b may include material(s) the same or similar to the adhesive 6.

Figure 4:
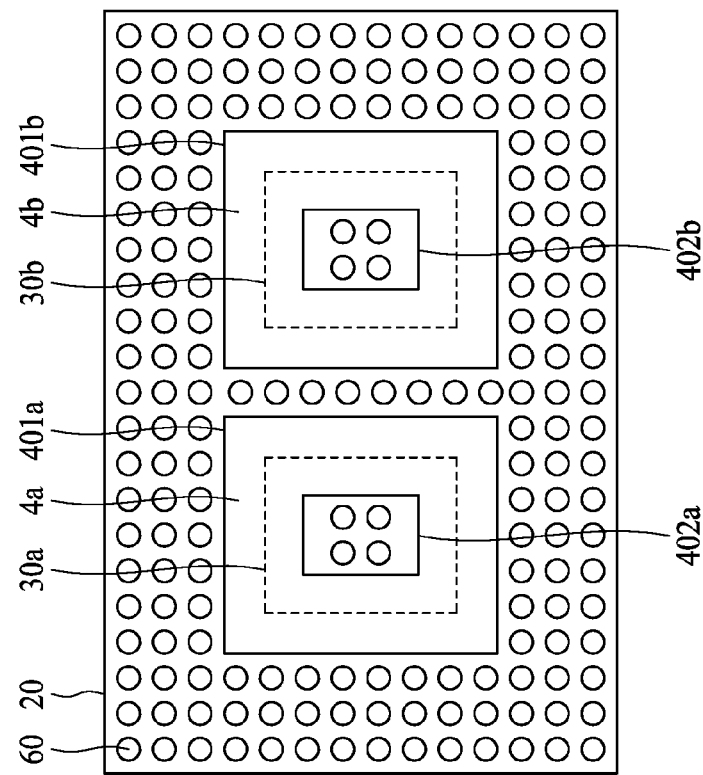
FIG. 4 illustrates a top surface perspective and a back surface perspective of the package structure of FIG. 3.
Figure 4:
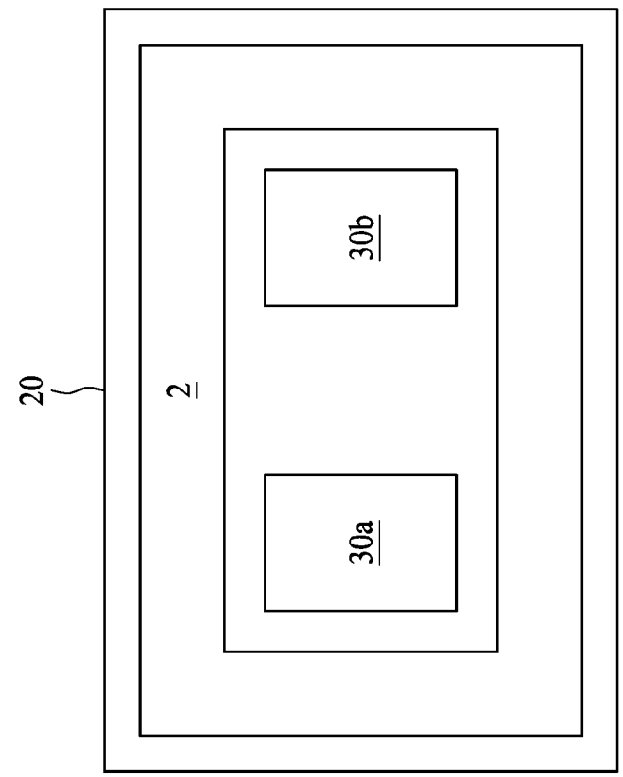

The package structure 300 includes two semiconductor structures 30a and 30b. Each of the semiconductor structures 30a and 30b may include a Chip-on-wafer (CoW) structure. In some embodiments, each of the semiconductor structures 30a and 30b may be a single chip, a three-dimensional (3D) IC or any other semiconductor component such as a passive component. The back side stiffeners 4a and 4b correspond to the semiconductor structures 30a and 30b respectively, and a dimension of the back side stiffeners 4a and 4b are determined according to a dimension of each of the semiconductor structures 30a and 30b. For ease of understanding, FIG. 4 illustrates a top surface perspective and a back surface perspective of the package structure 300 of FIG. 3. The left side of FIG. 4 shows the top surface perspective and the right side shows the back surface perspective. As can be seen from the top surface perspective, the front side stiffener 2 (the portion having dark color in the top surface perspective) is a tetragonal ring-like structure disposed substantially along four edges of the substrate 20 that has not difference from the front side stiffener arrangement of the package structure 200 shown in FIG. 2 despite that the package structure 300 has two flip chip and the package structure 200 has only one. It is because the dimension of the front side stiffener 2 is correlated to the dimension of the substrate 20 instead of the chips thereon.

The back side stiffeners 4a and 4b (the two portions having dark color in the back surface perspective), on the other hand, has its position and dimension correlated to the semiconductor structures 30a and 30b respectively. The semiconductor structures 30a and 30b are illustrated in dashed lines in the back surface perspective. According to an exemplary embodiment, when seeing from the back surface perspective, the back side stiffeners 4a and 4b are two tetragonal ring-like structures overlapping at least a projection of four edges of each of the semiconductor structures 30a and 30b respectively. In other words, an outer portion or an outer tetragonal ring of the back side stiffener 4a (i.e. the dark colored portion between outer edges 401a of the back side stiffener 4a and the edges of the semiconductor structure 30a in dashed lines) does not overlap a projection of the semiconductor structure 30a; and an inner portion or an inner tetragonal ring of the back side stiffener 4a (i.e. the dark colored portion between the edges of the semiconductor structure 30a in dashed lines and inner edges 402a of the back side stiffener 4a) overlaps the projection of the semiconductor structure 30a. An outer portion or an outer tetragonal ring of the back side stiffener 4b (i.e. the dark colored portion between outer edges 401b of the back side stiffener 4b and the edges of the semiconductor structure 30b in dashed lines) does not overlap a projection of the semiconductor structure 30b; and an inner portion or an inner tetragonal ring of the back side stiffener 4b (i.e. the dark colored portion between the edges of the semiconductor structure 30b in dashed lines and inner edges 402b of the back side stiffener 4b) overlaps the projection of the semiconductor structure 30b.

Compared to the front side stiffener 2, the back side stiffener 4a has its position and dimension correlated to the semiconductor structure 30a; and the back side stiffener 4b has its position and dimension correlated to the semiconductor structure 30b. It is helpful to reduce the package warpage in particular to the regions around the semiconductor structures 30a and 30b. The concept of arrangement of the stiffener 4 of the package structure 200 can be adopted for the stiffeners 4a and 4b. Therefore further details are omitted here for brevity.

Figure 5:
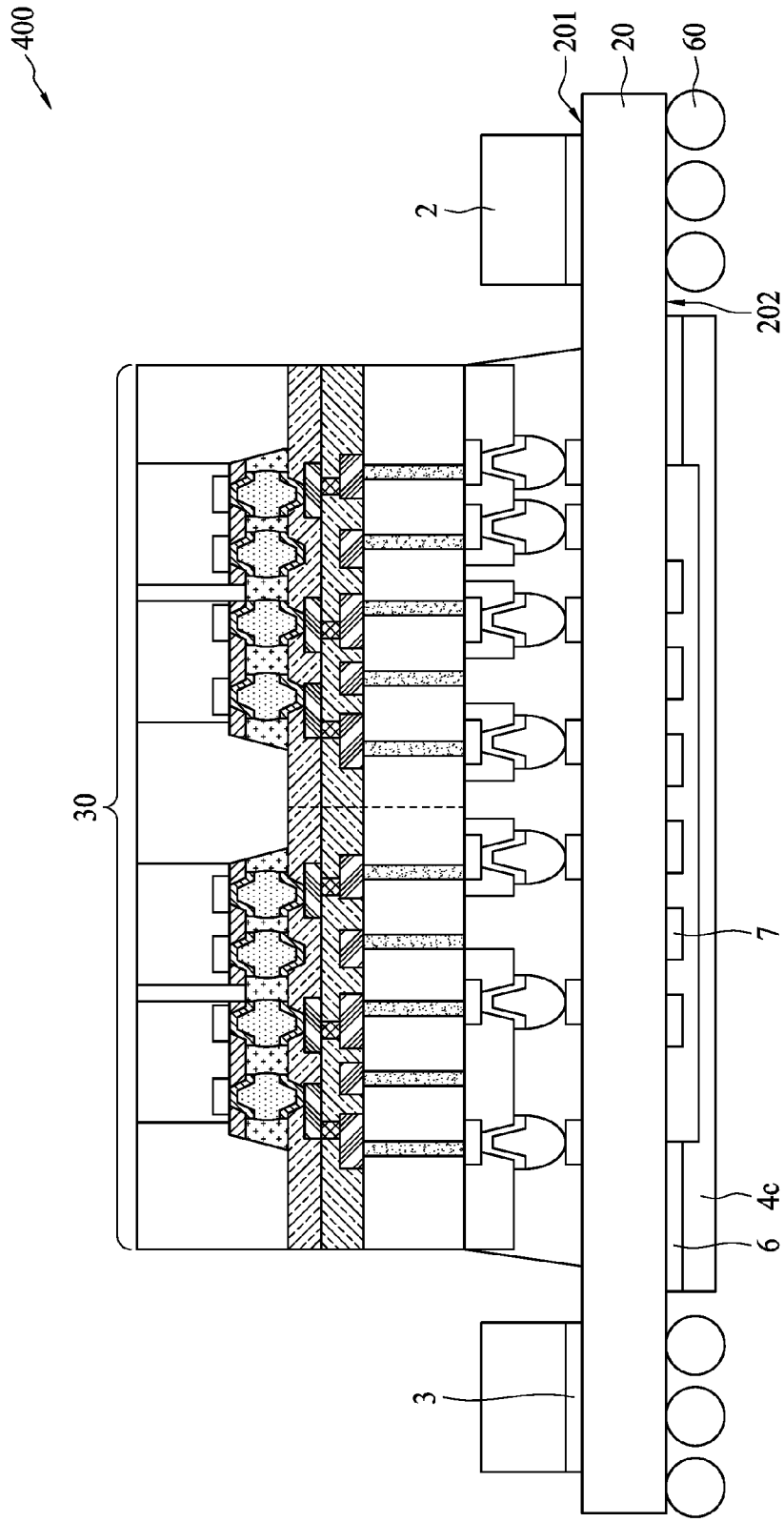
FIG. 5 is a cross-sectional view of a semi-finished package structure showing a back side stiffener mounted to a back side of a substrate, according to another embodiment of the present disclosure.

FIG. 5 is a cross-sectional view of a semi-finished package structure 400 showing a back side stiffener 4c mounted to a back surface 202 of a substrate 20, according to another embodiment of the present disclosure. Features in FIG. 5 that are similar to analogous features in FIG. 1 and FIG. 3 are similarly numbered for the sake of simplicity and clarity. The back side stiffener 4c may be mounted to the back surface 202 through adhesive 6. The back side stiffener 4c may include material(s) the same or similar to the stiffener 4.

The package structure 400 has a front side arrangement identical to the package structure 200 with the only semiconductor structure 30 surrounded by the front side stiffener 2. But the back side stiffener 4c has a structure different from the back side stiffener 4 of the package structure 200. The back side stiffener 4c is configured as a lid structure covering and overlapping a projection of the entire semiconductor structure 30 from the back surface 202 of the substrate 20. The back side stiffener 4c includes a flat plate portion and a tetragonal ring portion protruding from the flat plate portion, and the back side stiffener 4c is fixed to the back surface 202 of the substrate 20 through the tetragonal ring portion and the adhesive 6.

Figure 6:
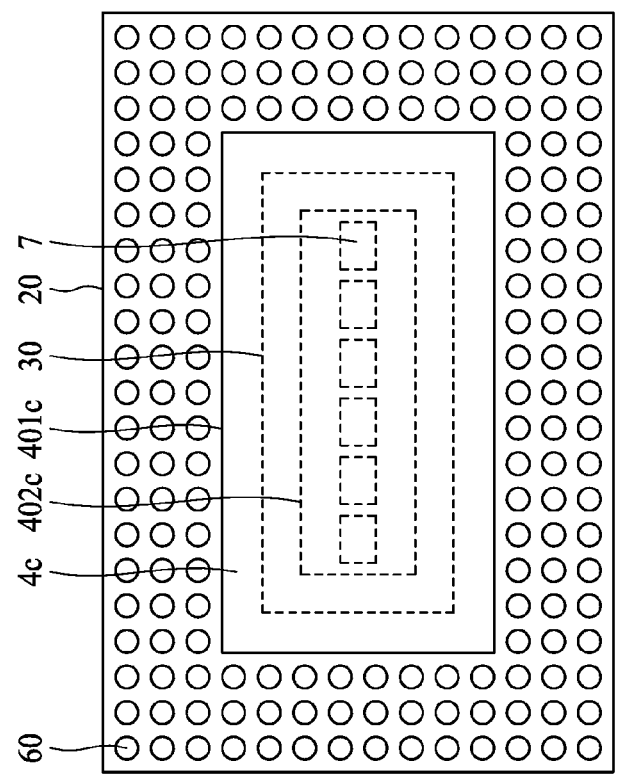
FIG. 6 illustrates a top surface perspective and a back surface perspective of the package structure of FIG. 5.
Figure 6:
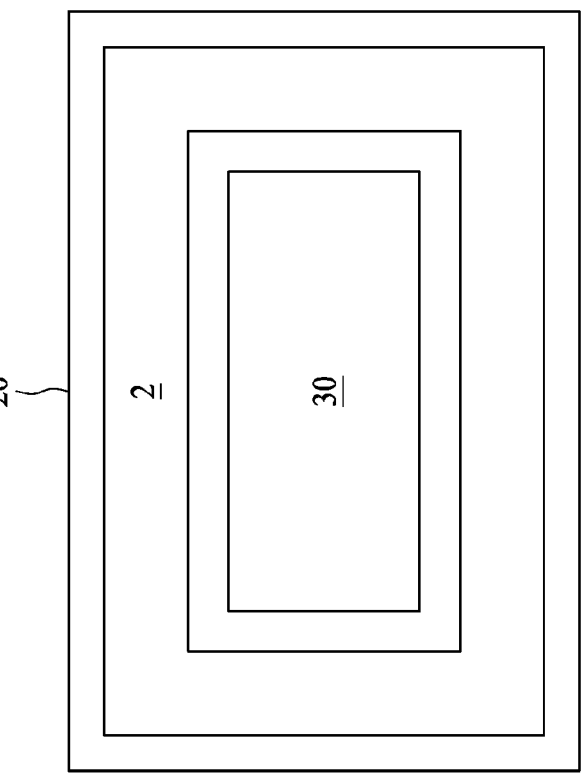

A dimension of the back side stiffener 4c is determined according to a dimension of the semiconductor structure 30. For ease of understanding, FIG. 6 illustrates a top surface perspective and a back surface perspective of the package structure 400 of FIG. 5. The left side of FIG. 6 shows the top surface perspective and the right side shows the back surface perspective. As can be seen from the top surface perspective, the front side stiffener 2 (the portion having dark color in the top surface perspective) is a tetragonal ring-like structure disposed substantially along four edges of the substrate 20 as mentioned above with respect to the left top surface perspective shown in FIG. 2. The back side stiffener 4c (the portion having dark color in the back surface perspective) has its position and dimension correlated to the semiconductor structure 30. The semiconductor structure 30 is illustrated in dashed lines in the back surface perspective. According to an exemplary embodiment, when seeing from the back surface perspective, the tetragonal ring portion of the back side stiffener 4c is between an outer ring 401c and an inner ring 402c as denoted in FIG. 6. The flat plate portion covers the entire dark colored portion within the outer ring 401c. The tetragonal ring portion of the back side stiffener 4c is a tetragonal ring-like structure overlapping at least a projection of four edges of the semiconductor structure 30. In other words, the outer portion or the outer tetragonal ring of the tetragonal ring portion of the back side stiffener 4c (i.e. the dark colored portion between outer edges 401c of the back side stiffener 4c and the edges of the semiconductor structure 30 in dashed lines) does not overlap a projection of the semiconductor structure 30; and an inner portion or an inner tetragonal ring of the tetragonal ring portion of the back side stiffener 4c (i.e. the dark colored portion between the edges of the semiconductor structure 30 in dashed lines and the inner edges 402c of the back side stiffener 4c) overlaps the projection of the semiconductor structure 30.

Compared to the back side stiffener 4, the back side stiffener 4c further includes a flat plate portion through which the rigidity of the overall back side stiffener 4c can be improved. The concept of arrangement of the stiffener 4 of the package structure 200 can be adopted for the tetragonal ring portion of the stiffener 4c. Therefore further details are omitted here for brevity. But the total number of the solder balls 60 is further sacrificed because the region within the inner edges 402c can no longer be used for accommodate solder balls 60. As such, the space between the lid structure and the substrate 20 may be used to contain some passive chip components to fully utilize the space according to the present embodiment. The passive chip components refer to such as a resistor, capacitor, or inductor possessing a specific electrical characteristic and not readily integratable into the semiconductor structure 30. It may be not economical to form all required resistors, capacitors, or inductors in an integrated circuit chip. For this reason, passive chip components 7 were combined with the semiconductor structure 30 as shown in FIG. 5 and FIG. 6. To illustrate, the passive chip components 7 are attached to the back surface 202 of the substrate 20 within the inner edges 402c. The height of the space between the substrate 20 and the lid structure of the back side stiffener 4c should be at least greater than the height of the passive chip components 7.

Similar to the stiffeners 4, 4a and 4b, a height of the stiffener 4c is limited to be relatively lower than a height of the solder balls 60. In this way, the package structure 200 can be assembled to another substrate through the solder balls 60 without being stuck by the back side stiffener 4c. The another substrate may be a printed wire board (also sometimes called a printed circuit board) or a multilayer module known to those skilled in the art.

The back side stiffeners described above of the present disclosure are able to further reduce package warpage, especially for the die region where the flip chip locates instead of the overall substrate. The back side stiffeners may further reduce warpage at the die region. For example, for a package structure that already has the front side stiffener, about 12.5% of warpage at a die region can be further reduced by the back side stiffener. In some embodiments, about 10% of a total number of solder balls may be sacrificed because some solder ball space is now reserved for the back side stiffener. The concept may not only be limited to package structures, but can also be applied to those packages having a large size.

Some embodiment of the present disclosure provides a semiconductor package structure, including: a substrate having a front surface and a back surface; a chip-on-interposer structure mounted on the front surface of the substrate; a back side stiffener mounted over the back surface of the substrate and surrounding a projection of the chip-on-interposer structure from a back surface perspective; and a plurality of conductive bumps mounted on the back surface of the substrate.

Some embodiment of the present disclosure provides a semiconductor package structure, including: a substrate having a front surface and a back surface; a first semiconductor structure mounted on the front surface of the substrate; a second semiconductor structure mounted on the front surface of the substrate; a front side stiffener mounted over the front surface of the substrate and substantially along four edges of the substrate; a first back side stiffener mounted over the back surface of the substrate and surrounding a projection of the first semiconductor structure from a back surface perspective; a second back side stiffener mounted over the back surface of the substrate and surrounding a projection of the second semiconductor structure from the back surface perspective; and a plurality of conductive bumps mounted on the back surface of the substrate.

Some embodiment of the present disclosure provides a semiconductor package structure, including: a substrate having a front surface and a back surface; a semiconductor structure mounted on the front surface of the substrate; a back side stiffener including a tetragonal ring portion and a flat plate portion, the back side stiffener being mounted over the back surface of the substrate; and a plurality of conductive bumps mounted on the back surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a substrate having a front surface and a back surface;
   a chip-on-interposer structure mounted on the front surface of the substrate;
   a back side stiffener mounted over the back surface of the substrate and surrounding a projection of the chip-on-interposer structure from a back surface perspective; and
   a plurality of conductive bumps mounted on the back surface of the substrate.

2. The semiconductor package structure of claim 1, further comprising a front side stiffener mounted over the front surface of the substrate substantially and along four edges of the substrate.

3. The semiconductor package structure of claim 1, wherein the back side stiffener is a tetragonal ring having four outer edges and four inner edges from the back surface perspective.

4. The semiconductor package structure of claim 3, wherein the back side stiffener overlaps a projection of at least four edges of the chip-on-interposer structure from a back surface perspective.

5. The semiconductor package structure of claim 4, wherein the back side stiffener includes an outer tetragonal ring portion and an inner tetragonal ring portion, the outer tetragonal ring portion not overlapping the projection of the chip-on-interposer structure, the inner tetragonal ring portion overlapping the projection of the chip-on-interposer structure, and a width of the outer tetragonal ring portion is substantially the same with a width of the inner tetragonal ring portion from the back surface perspective.

6. The semiconductor package structure of claim 3, wherein a portion of the conductive bumps is disposed within the four inner edges of the back side stiffener.

7. The semiconductor package structure of claim 1, wherein the back side stiffener comprises copper.

8. A semiconductor package structure, comprising:
   a substrate having a front surface and a back surface;
   a first semiconductor structure mounted on the front surface of the substrate;
   a second semiconductor structure mounted on the front surface of the substrate;
   a front side stiffener mounted over the front surface of the substrate and substantially along four edges of the substrate;
   a first back side stiffener mounted over the back surface of the substrate and surrounding a projection of the first semiconductor structure from a back surface perspective;
   a second back side stiffener mounted over the back surface of the substrate and surrounding a projection of the second semiconductor structure from the back surface perspective; and
   a plurality of conductive bumps mounted on the back surface of the substrate.

9. The semiconductor package structure of claim 8, wherein the first back side stiffener is a tetragonal ring having four outer edges and four inner edges from the back surface perspective; and the second back side stiffener is a tetragonal ring having four outer edges and four inner edges from the back surface perspective.

10. The semiconductor package structure of claim 9, wherein the first back side stiffener overlaps a projection of at least four edges of the first semiconductor structure from the back surface perspective; and the second back side stiffener overlaps a projection of at least four edges of the second semiconductor structure from the back surface perspective.

11. The semiconductor package structure of claim 9, wherein a portion of the conductive bumps is disposed within the four inner edges of the first back side stiffener and the four inner edges of the second back side stiffener.

12. The semiconductor package structure of claim 8, wherein the back side stiffener comprises brass.

13. The semiconductor package structure of claim 8, wherein a height of the back side stiffener is less than a height of the conductive bumps.

14. A semiconductor package structure, comprising:
   a substrate having a front surface and a back surface;
   a semiconductor structure mounted on the front surface of the substrate;
   a back side stiffener including a tetragonal ring portion and a flat plate portion, the back side stiffener being mounted over the back surface of the substrate; and
   a plurality of conductive bumps mounted on the back surface of the substrate.

15. The semiconductor package structure of claim 14, further comprising a front side stiffener mounted over the front surface of the substrate and substantially along four edges of the substrate.

16. The semiconductor package structure of claim 14, wherein the tetragonal ring portion has four outer edges and four inner edges from a back surface perspective, and the tetragonal ring portion overlaps a projection of at least four edges of the semiconductor structure from the back surface perspective.

17. The semiconductor package structure of claim 16, wherein the flat plate portion covers a space defined by the four inner edges from the back surface perspective, and the back side stiffener is mounted over the back surface of the substrate through the tetragonal ring portion.

18. The semiconductor package structure of claim 14, wherein the flat plate portion fully overlaps a projection of the semiconductor structure from the back surface perspective.

19. The semiconductor package structure of claim 14, further comprising a passive chip component disposed over the back side of the substrate within the four inner edges of the tetragonal ring portion, a height of the passive chip component being less than a distance between the flat plate portion and the back surface of the substrate.

20. The semiconductor package structure of claim 14, wherein the back side stiffener comprises stainless steel.

\* \* \* \* \*